United States Patent
Leem

(10) Patent No.: US 8,709,835 B2
(45) Date of Patent: Apr. 29, 2014

(54) METHOD FOR MANUFACTURING LIGHT EMITTING DIODES

(75) Inventor: See jong Leem, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/450,343

(22) Filed: Jun. 12, 2006

(65) Prior Publication Data

US 2006/0286697 A1     Dec. 21, 2006

(30) Foreign Application Priority Data

Jun. 16, 2005  (KR) .................. 10-2005-0051671

(51) Int. Cl.
*H01L 21/00*     (2006.01)

(52) U.S. Cl.
USPC .................. 438/22; 438/34; 438/42

(58) Field of Classification Search
USPC ................................ 438/22–47
See application file for complete search history.

(56) References Cited

U.S. PATENT DOCUMENTS

| | | | |
|---|---|---|---|
| 6,331,356 B1 * | 12/2001 | Angelopoulos et al. ... | 428/411.1 |
| 6,413,851 B1 | 7/2002 | Chow et al. | |
| 6,495,862 B1 | 12/2002 | Okazaki et al. | |
| 6,498,355 B1 | 12/2002 | Harrah | |
| 6,562,648 B1 | 5/2003 | Wong et al. | |
| 6,870,191 B2 | 3/2005 | Niki et al. | |
| 2002/0182839 A1 | 12/2002 | Ogawa et al. | |
| 2002/0190263 A1 | 12/2002 | Hata et al. | |
| 2003/0025203 A1 | 2/2003 | Akram et al. | |
| 2003/0094963 A1 | 5/2003 | Fang | |
| 2003/0111667 A1 | 6/2003 | Schubert | |
| 2003/0129310 A1 | 7/2003 | Sinha | |
| 2003/0143772 A1 * | 7/2003 | Chen .............................. | 438/47 |
| 2003/0166330 A1 | 9/2003 | Tong et al. | |
| 2003/0178626 A1 * | 9/2003 | Sugiyama et al. .............. | 257/79 |
| 2003/0189215 A1 | 10/2003 | Lee | |
| 2003/0218179 A1 | 11/2003 | Koide et al. | |
| 2003/0222263 A1 | 12/2003 | Choi | |
| 2004/0104395 A1 | 6/2004 | Hagimoto et al. | |
| 2004/0113167 A1 | 6/2004 | Bader et al. | |
| 2004/0125454 A1 * | 7/2004 | Kawasaki et al. ............. | 359/569 |
| 2004/0222434 A1 | 11/2004 | Uemura | |
| 2005/0001227 A1 * | 1/2005 | Niki et al. ........................ | 257/98 |
| 2005/0017262 A1 | 1/2005 | Shei | |
| 2005/0067636 A1 | 3/2005 | Amoh et al. | |
| 2005/0104081 A1 | 5/2005 | Kim et al. | |
| 2005/0176234 A1 | 8/2005 | Shei et al. | |
| 2005/0227379 A1 * | 10/2005 | Donofrio ......................... | 438/4 |
| 2005/0285132 A1 * | 12/2005 | Orita ............................... | 257/99 |
| 2006/0043384 A1 * | 3/2006 | Cho et al. ....................... | 257/79 |

(Continued)

FOREIGN PATENT DOCUMENTS

| | | |
|---|---|---|
| EP | 1450417 | 8/2004 |
| JP | 4-283948 | 10/1992 |

(Continued)

*Primary Examiner* — Jae Lee
(74) *Attorney, Agent, or Firm* — McKenna Long & Aldridge LLP

(57) ABSTRACT

A method for manufacturing the LEDs is disclosed, whereby the light extraction efficiency of the device can be enhanced by forming patterns on a top surface of a substrate, a light emitting structure is formed on the top surface of the substrate formed with the patterns, the substrate is removed from the light emitting structure, and patterns corresponding to those formed on top surface of the substrate are formed on the surface of the light emitting structure.

30 Claims, 11 Drawing Sheets

(56) References Cited

U.S. PATENT DOCUMENTS

| | | | |
|---|---|---|---|
| 2006/0043513 A1* | 3/2006 | Kim | 257/433 |
| 2006/0079027 A1* | 4/2006 | Yamada et al. | 438/121 |
| 2006/0151793 A1 | 7/2006 | Nagai | |
| 2006/0202352 A1* | 9/2006 | Li et al. | 257/779 |
| 2006/0231852 A1* | 10/2006 | Kususe et al. | 257/99 |
| 2006/0237735 A1 | 10/2006 | Naulin et al. | |
| 2006/0273341 A1 | 12/2006 | Lee et al. | |
| 2007/0029568 A1* | 2/2007 | Choo et al. | 257/99 |
| 2007/0102692 A1 | 5/2007 | Asahara et al. | |

FOREIGN PATENT DOCUMENTS

| | | | |
|---|---|---|---|
| JP | 6-326210 | 11/1994 | |
| JP | 7-078807 | 3/1995 | |
| JP | 9-092877 | 4/1997 | |
| JP | 9-092878 | 4/1997 | |
| JP | 10-270761 | 10/1998 | |
| JP | 2001-313436 | * 11/2001 | H01S 5/02 |
| JP | 2001-313436 A | 11/2001 | |
| JP | 2003-197961 | 7/2003 | |
| JP | 2004-047704 | 2/2004 | |
| JP | 2004128507 | 4/2004 | |
| JP | 2004146652 | 5/2004 | |
| JP | 2004-228540 | 8/2004 | |
| JP | 2004-265959 | 9/2004 | |
| JP | 2005-039197 | 2/2005 | |
| JP | 2005-150675 A | 6/2005 | |
| KR | 10-2005-0041536 A | 5/2005 | |
| KR | 2005-0090186 | 9/2005 | |
| KR | 100588377 | 6/2006 | |
| WO | WO 2005/008791 | 1/2005 | |
| WO | WO 2005/015648 | 2/2005 | |
| WO | WO 2005-088743 | 9/2005 | |
| WO | WO 2006-006556 | 1/2006 | |

* cited by examiner

METHOD FOR MANUFACTURING LIGHT EMITTING DIODES

CROSS-REFERENCE TO RELATED APPLICATION

This application claims priority to application filed in the Korean Industrial Property Office on Jun. 16, 2005, and assigned serial No.10-2005-0051671, the contents of which are incorporated herein by reference.

BACKGROUND

This description generally relates a method for manufacturing light emitting diodes.

Typically, Gallium nitride (GaN)-based group-III compound semiconductor light-emitting diodes (hereinafter referred to as LEDs) have a broad band gap and an excellent reliability over diodes using other semiconductors, enabling to develop LEDs covering a wide range of light emitting spectrums from ultraviolet to infrared rays.

Recent advancement in technologies for semiconductor LEDs made of group-III nitride compound allows the diodes to be employed for various fields of commercial purposes.

Particularly, the GaN-based group-III compound semiconductor LEDs are widely used for sign boards, displays, backlights and electric bulbs, and application thereof is being gradually on the increase. It is therefore very important to develop high-end LEDs.

FIG.1 is a cross-sectional view of group-III nitride semiconductor LEDs. The diode is formed by sequentially depositing on a sapphire substrate a buffer layer 110, an N-GaN layer 112, an active layer 113 and a P-GaN layer 114. Furthermore, mesa-etching is performed from the P-GaN layer 114 to part of the N-GaN layer 112, and a transparent electrode 115 is formed on an upper surface of the P-GaN layer 114. An N-type metal layer 117 is formed on an upper surface of the mesa-etched N-GaN layer 112 such that, if a voltage is applied via N and P electrodes, electrons and holes flow into the active layer 113 from the N-GaN layer 112 and the P-GaN layer 114 to generate electron-hole re-combination and light.

However, there is a problem in that heat generated in the course of diode operation cannot be smoothly emitted to degrade the characteristic of the diode because the LEDs are fabricated from a sapphire substrate having a low thermal conductivity.

There is another problem in that electrodes cannot be formed on and under the LEDs and instead are formed at the same direction, as shown in FIG. 1, suffering a partial removal of an active layer. As a result, a light emitting area is reduced to make it difficult to realize high-quality LEDs having a high luminance. The number of chips generated from the same wafer is inevitably reduced, thereby complicating the fabricating processes involving two-times of bonding during the assembly.

There is still another problem in that the yield rate suffers due to facet mismatch between hardness of a sapphire substrate and a relatively softer GaN-based layer when the sapphire substrate is used in the lapping, polishing, scribing and breaking processes for separating a wafer into unit chips after LED chip process is finished on the wafer.

FIG. 2 is a conceptual diagram illustrating a phenomenon in which light emitted from a nitride-based compound LED is totally reflected and confined within the device according to the prior art.

First, light traveling between two media each having a different refractive index experiences reflection and transmission at an interface, and if an incident angle is equal or larger than a prescribed angle, the transmission is not realized and a total internal reflection occurs, at which time, the angle is called a critical angle.

In other words, if the light emitted from an active layer 153 of the nitride compound LED of the prior art travels toward a transparent electrode 155 at an angle larger than the critical angle, it is totally reflected and confined within the device, and absorbed into the epitaxial layer of the device and the sapphire substrate 151, thereby decreasing the external quantum efficiency.

SUMMARY

The present invention is conceived to solve the aforementioned problems and it is an object of the present invention to provide a method for manufacturing light emitting diodes by which a pattern is embedded on a top surface of a substrate, a light emitting structure is formed on the pattern-embedded substrate, pattern impressions are embedded on a surface of the light emitting structure generated by separating the substrate from the light emitting structure, and patterns corresponding to those on the top surface of the substrate are formed, thereby enhancing the light extraction efficiency of the device.

In one general aspect, a method for manufacturing light emitting diodes comprises; forming patterns on a top surface of a substrate; forming on a top surface of the pattern-formed substrate a first layer having a first polarity, an active layer, a second layer having an opposite polarity from that of the first layer, and a first electrode; bonding a support to a top surface of the first electrode; performing a lift-off process in which the patterned substrate is separated from the first layer to form patterns on the first layer corresponding to those formed on the top surface of the substrate; and forming a second electrode on the first layer.

In another general aspect, a method for manufacturing light emitting diodes comprises: forming patterns on a top surface of a substrate; forming on the top surface of the pattern-formed substrate a first layer having a first polarity, an active layer, a second layer having an opposite polarity from that of the first layer, and a first electrode; forming a conductive holder on a top surface of the first electrode; performing a lift-off process in which the patterned substrate is separated from the first layer to form patterns on the first layer corresponding to those formed on the top surface of the substrate; and forming a second electrode on the first layer.

In still another general aspect, a method for manufacturing light emitting diodes comprises: forming patterns on a top surface of a substrate; forming on the top surface of the pattern-formed substrate an N-GaN layer, an active layer, a P-GaN layer and a first electrode; forming a reflection layer on a top surface of the first electrode; forming a conductive holder on a top surface of the reflection layer; performing a lift-off process in which the patterned substrate is separated from the n-GaN layer to form on the n-GaN layer patterns corresponding to those formed on the top surface of the substrate; and forming a second electrode on the n-GaN layer.

DETAILED DESCRIPTION

Figure 1:
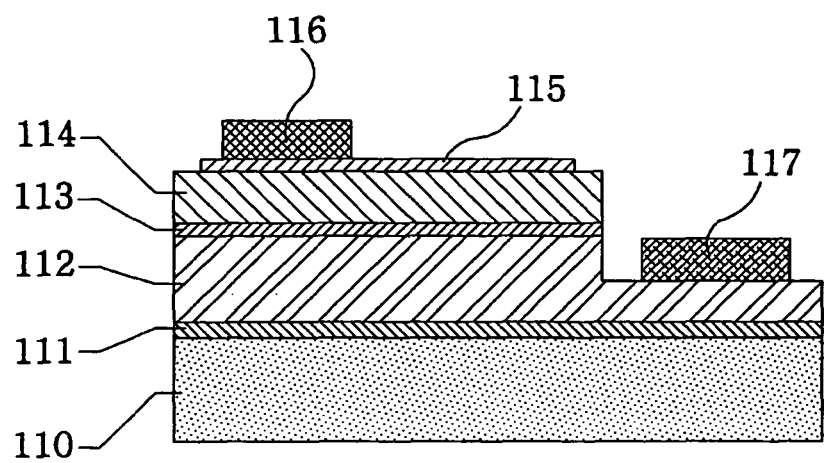
FIG. 1 is a cross-sectional view of group-III nitride semiconductor LEDs.
Figure 2:
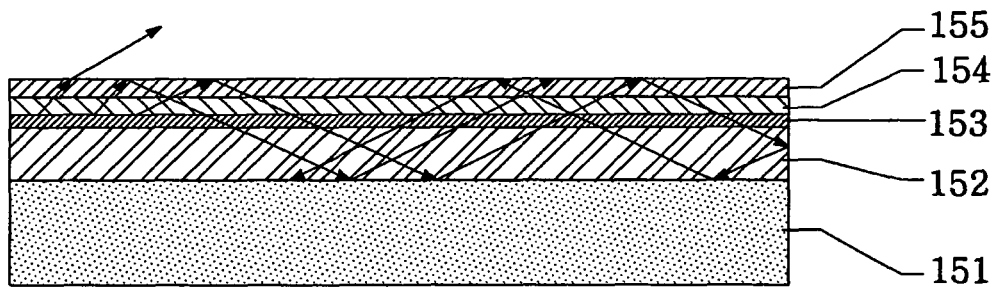
FIG. 2 is a conceptual diagram illustrating a phenomenon in which light emitted from a nitride-based compound LED is totally reflected and confined within the device according to the prior art.
Figure 3A:
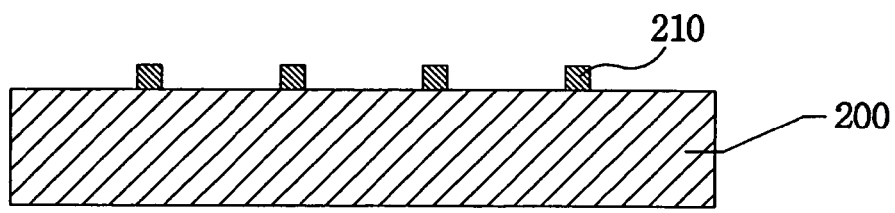
FIGS. 3a to 3e are cross-sectional views illustrating a method for manufacturing light emitting diodes according to the present invention.

Referring to FIGS. 3a to 3e, patterns 210 are formed on a top surface of a substrate 200 (FIG. 3a). Here, the patterns 210 are defined by protrusions, depressions or combinations of the protrusions and the depressions on the top surface of the substrate 200.

Figure 3B:
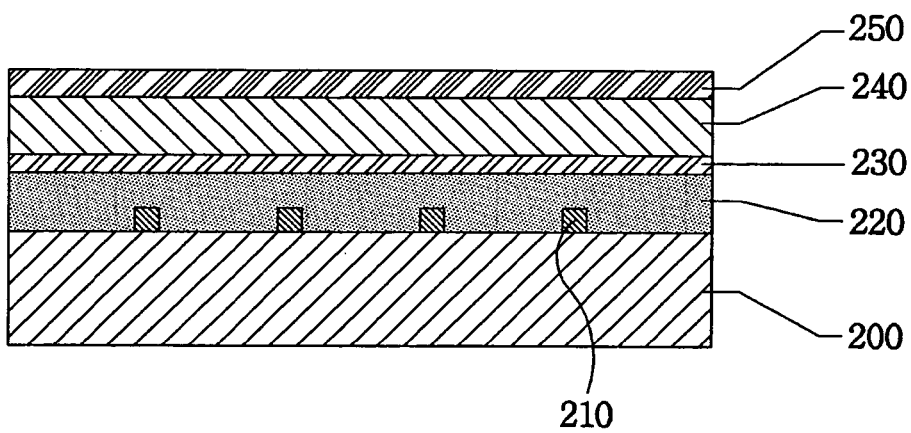
Figure 3C:
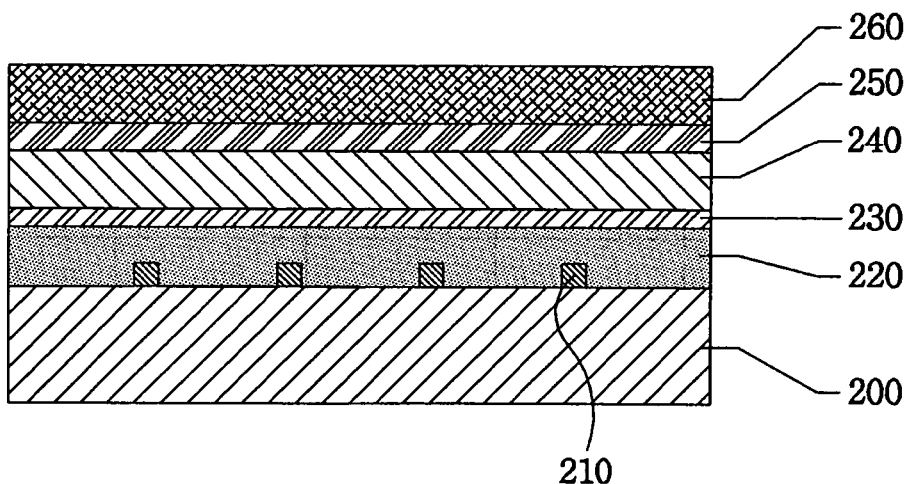

The substrate 200 formed with the patterns 210 is formed on the top surface thereof with a first layer 220 having a first polarity, an active layer 230, a second layer 240 having a polarity opposite to that of the first layer 220, and a first electrode 250 (FIG. 3b). Successively, the first electrode 250 is bonded to a top surface of a support 260 (FIG. 3c).

The support 260 serves to securely fix a light emitting structure comprising the first layer 220, the active layer 230 and the second layer 240 when the substrate 200 is removed in a process (described later). Preferably, the support 260 is a sub-mount substrate formed with an ohmic contact material on and underneath a conductive substrate. The sub-mount substrate is an example of a support, but is not limited thereto.

The first electrode 250 may be further formed thereon with a metallurgic layer as an Under Bump Metallurgy (UBM) layer, and the support 260 may be bonded to the UBM layer via solder. Between the first electrode 250 and the UBM layer a process may be further conducted for forming a reflection layer comprising at least one or a combination of Ag, Al, Pt, Au, Ni, Ti, and a transmissive conductive oxide layer.

Figure 3D:
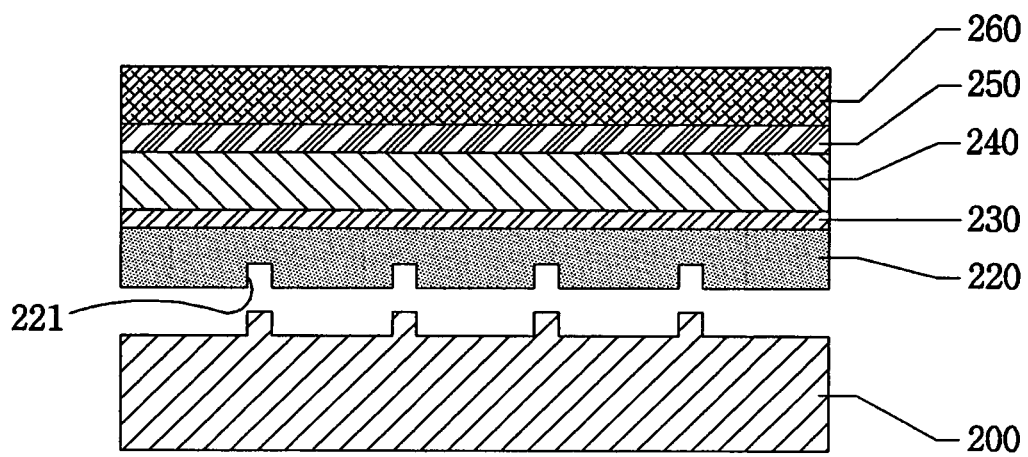
Figure 3E:
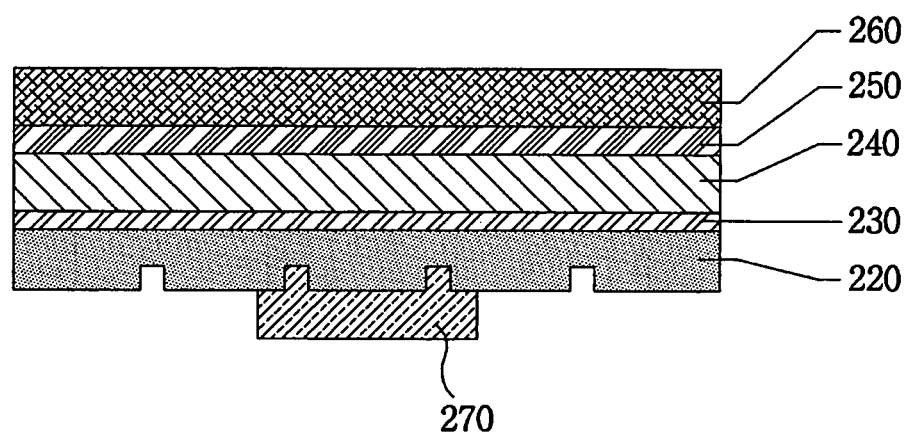

Next, a lift-off process is performed for separating the patterned substrate 200 from the first layer 220 to form patterns 221 corresponding to those formed on the top surface of the substrate 200 on the first layer 220 (FIG. 3d). Successively, the first layer 220 formed with the patterns 221 is formed with a second electrode 270 (FIG. 3e). The manufacturing of an LED is completed by the afore-said process of FIG. 3a.

Meanwhile, the first and second layers 220 and 240 are preferred to be made of compound semiconductor. Preferably, the first layer 220 is n-GaN layer and the second layer 240 is p-GaN layer.

Figure 4A:
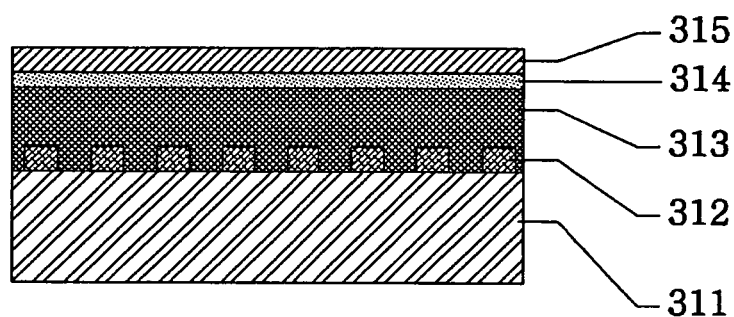
FIGS. 4a and 4b are cross-sectional views illustrating a method for forming an LED structure according to the present invention.
Figure 4B:
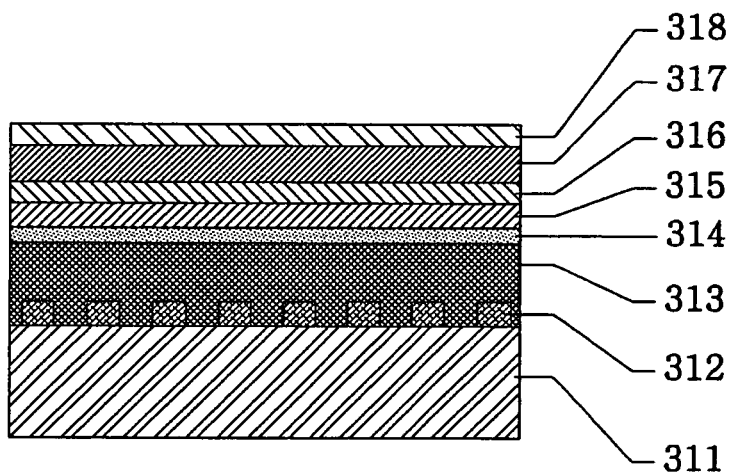

Now, turning to FIGS. 4a and 4b, a substrate 311 is formed with patterns 312 on a top surface thereof (FIG. 4a).

The formation of patterns 312 on the top of the substrate 311 can be effected by forming a mask having predetermined patterns on the substrate 311 and etching the substrate 311 by dry or wet etching process. Another method is to form an undoped un-GaN layer on the top surface of the substrate 311 and to etch it having predetermined patterns via wet etching, dry etching and HVPE (Hydride Vapor Phase Epitaxy). process.

More preferably, as there is an inconvenience of using patterned mask for wet or dry etching process, laser beam is irradiated on a predetermined region of the undoped un-GaN layer formed on the substrate 311 to form patterns 312.

Next, a MOCVD process is performed on the top surface of the substrate 311 formed with the patterns 312 to sequentially laminate an N-GaN layer 313, an active layer 314 and a P-GaN layer 315, and a heat treatment is carried out for approximately 20 minutes under 600 degrees Celsius in order to activate impurities of the P-GaN layer 315 (FIG. 4a).

A P-ohmic contact material 316 is formed on a top surface of the P-GaN layer 315 to form an UBM layer 318. Preferably, the P-ohmic material 316 is formed thereon with a reflection metal 317 for better light extraction efficiency (FIG. 4b). The P-ohmic material 316 formed on top of the P-GaN layer 315 is used as a P-electrode.

The ohmic contact material, if an electrode is formed on the GaN layer, is prepared for maintaining a high transmittance and obtaining excellent ohmic conduction properties as well, such that all ohmic contact materials known in the arts may be used.

There is no limit for the reflection metal 317 as long as it has properties for light reflection, but preferably, the reflection metal 317 is selectively formed with any one of Ag, Al, Pt, Au, Ni, Ti, ATO ($SnO_2$ doped with Sb) and ITO, and its thickness exceeds 0.2 μm.

Preferably, the UBM layer 318 is any one of the laminated structure of Ti/Pt/Au, or Ti/Au, Ni/Au and Pt/Au.

It may be possible to form a buffer layer (not shown) before the pattern-formed substrate 311 is disposed thereon with the N-GaN layer 313 in the light emitting structure.

Preferably, the buffer layer is deposited by epitaxially growing an undoped nitride compound semiconductor layer in the horizontal and longitudinal directions by the MOCVD process or a high GaN growth rate of HVPE process. Preferably, the buffer layer selectively comprises any one of AlN, GaN and AlInN layer.

FIGS. 5a to 5f are perspective views illustrating a form of a substrate pattern according to the present invention, wherein patterns 312 may be formed in various shapes, and are not limited thereto as shown in the drawings.

Figure 5A:
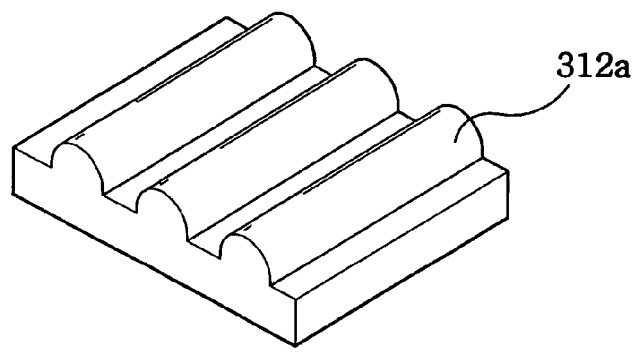
FIGS. 5a to 5f are perspective views illustrating a form of a substrate pattern according to the present invention.
Figure 5B:
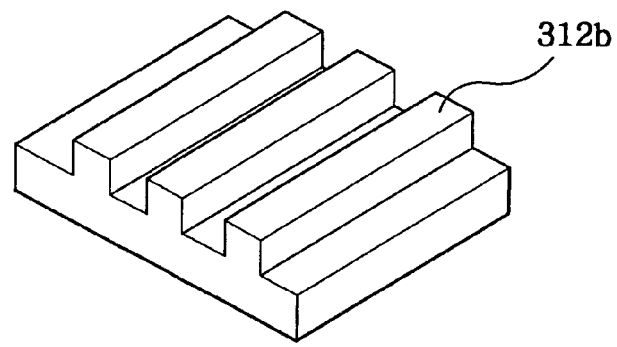
Figure 5C:
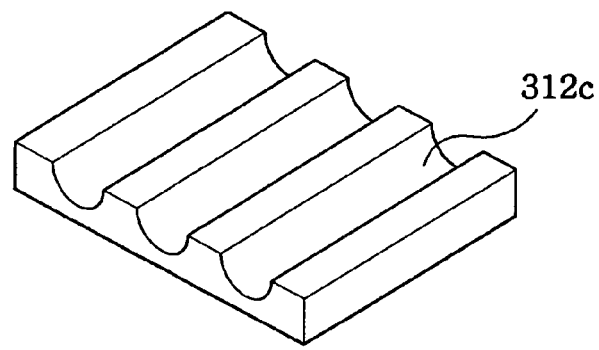

It is preferred however that each pattern 312 be any one of a plurality of protruding striped shapes as shown in FIGS. 5a and 5b, a plurality of depressed striped shapes and a plurality of depressed scratched shapes as depicted in FIG. 5c. Although it is not shown in the drawing, the depressed scratched shapes of patterns define disorderly scratched states of patterns. Therefore, depressed scratched shapes of patterns are formed on the substrate with irregular, disorderly and scratched grooves.

Furthermore, in a different concept, each pattern 312 is preferred to have any one of a dome shape, a rod shape and a plurality of square pillars each having any one shape of a depression, a protrusion, and a combination of depression and protrusion. Here, each of the square pillar, the dome and the rod shape has any one of the depression shape, the protrusion shape, and a combination of depression and protrusion shapes.

Figure 5D:
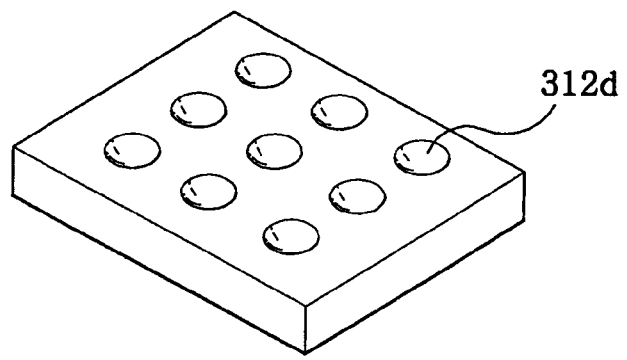
Figure 5E:
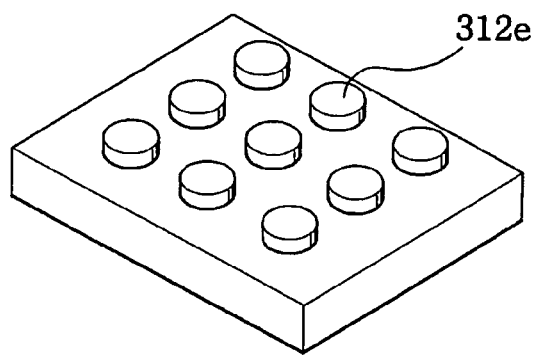
Figure 5F:
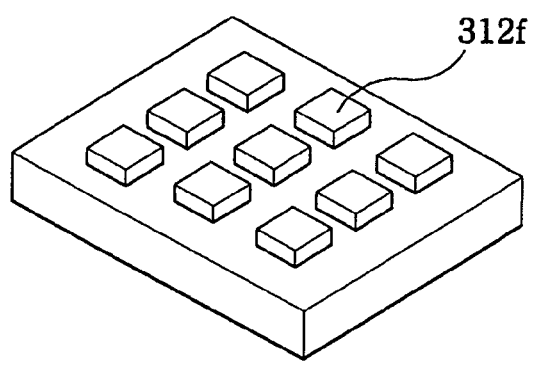

Reference numeral '312d' of FIG. 5d illustrates lens-shaped domes in depressed configuration, '312e' of FIG. 5e illustrates block-shaped rods, and '312f' of FIG. 5f illustrates block-shaped square rods.

Preferably, height (depth), width and length of each pattern 312 is in the range of 0.001~100 μm, an angle of each pattern shaped corner and apex is in the range of 0~180 degrees and there is no limit for radius of curvature for depressed lens-shaped domes.

There is no particular limit for kinds of the substrate 311 and any substrate may be selected as long as the substrate can grow expitaxial layers.

In wit, the substrate may include: any one of a sapphire substrate, a silicon substrate, a zinc oxide substrate and a nitride semiconductor substrate; a template substrate laminated on a sapphire substrate, a silicon substrate and a zinc oxide substrate with any one of GaN, InGaN, AlGaN and AlInGaN; and any one substrate formed with a dielectric layer on these substrates.

Material of the dielectric layer is not particularly limited but the dielectric layer may be constructed with an alumina, an yttria oxide, a silica, a silicon nitride, a silicon oxide, a PZT (Lead Zirconium Titanium: $PbTiO_3$—$PbZrO_3$), a perovskite-based oxide film such as a PLZT (Lead Lanthanum Zirconium Titanium: $PbTiO_3$—$PbZrO_3$—$La_2O_3$), and Strontium-Bismuth-Tantalum oxide film such as SBT (Strontium Bismuth Tantalum: $SrBi_2Ta_2O_9$).

Figure 6A:
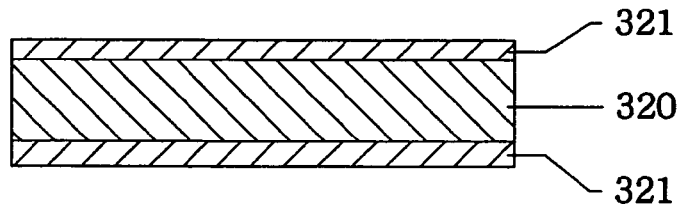
FIGS. 6a and 6b are cross-sectional views illustrating a method for manufacturing a sub-mount substrate which is a kind of supports according to the present invention.
Figure 6B:
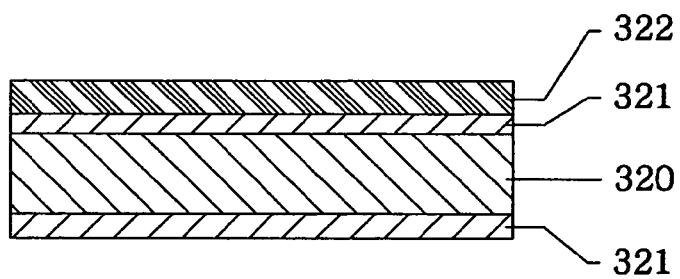

Referring now to FIGS. 6a and 6b, a conductive substrate 320 is formed thereon and thereunder with ohmic contact materials 321 and 322 (FIG. 6a).

The conductive material 320 is more desirable to be of a material having an excellent heat and electricity conductivity. The conductive substrate 320 is more desirable to have a thermal expansion coefficient similar to that of an epitaxial layer. Preferably, the conductive substrate 320 contains at least one or more of a group of Si, AlN, SiC, GaAs, Cu, W and Mo.

Next, the conductive substrate 320 formed with ohmic contact materials 321 and 322 is laminated thereon with a solder 322 (6b). As a result, manufacturing of a sub-mount substrate 350 formed with ohmic contact materials on and under the conductive substrate, a kind of afore-said support, is completed.

Figure 7A:
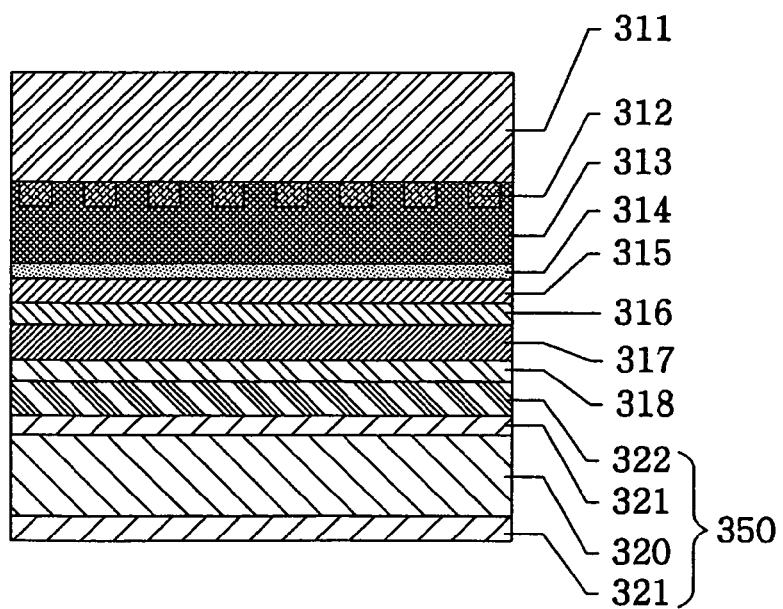
FIGS. 7a to 7d are cross-sectional views illustrating a method for manufacturing an LED by bonding a sub-mount to a light emitting structure according to the present invention.

Now, turning to FIGS. 7a to 7d, a solder 322 of the sub-mount substrate 350 is stacked with and bonded to a reverse-laminated light emitting structure on the sub-mount substrate 350 so that the UBM layer 318 of the reverse-laminated light emitting structure can be contacted (FIG. 7a).

At this time, the light emitting structure, as shown in FIG. 7a, defines a structure completed with the process of FIG. 4b including the N-GaN layer 313, the active layer 314 and the P-GaN layer 315. The structure is the one for manufacturing one or more LEDs, and the structure in FIGS. 7a to 7d is the one for manufacturing a plurality of LEDs.

Figure 7B:
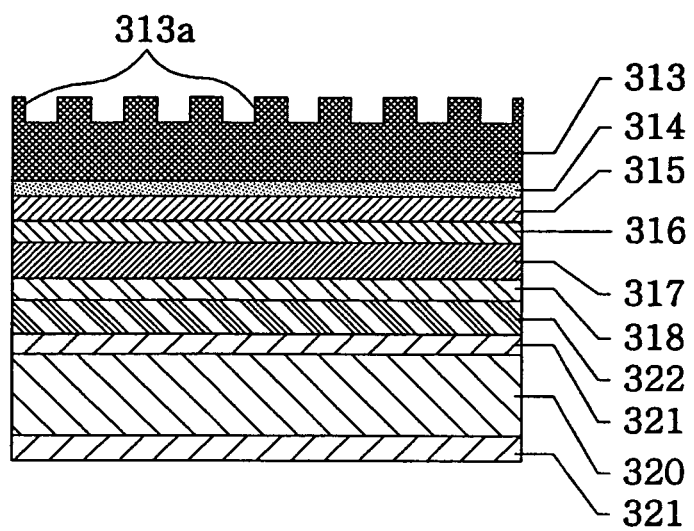

Now, the substrate 311 is removed from the N-GaN layer 313 via the lift-off process (FIG. 7b). At this time, patterns 313a corresponding to those formed on the top surface of the substrate 311 are left behind on the surface of the N-GaN layer 313 removed of the substrate 311.

Figure 7C:
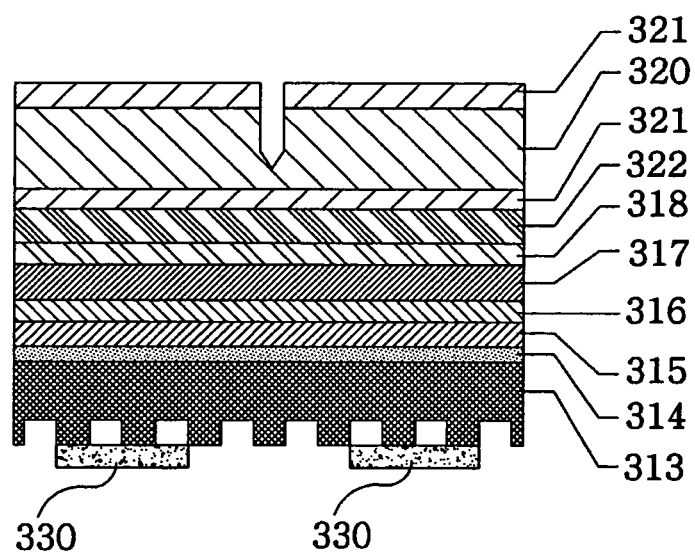
Figure 7D:
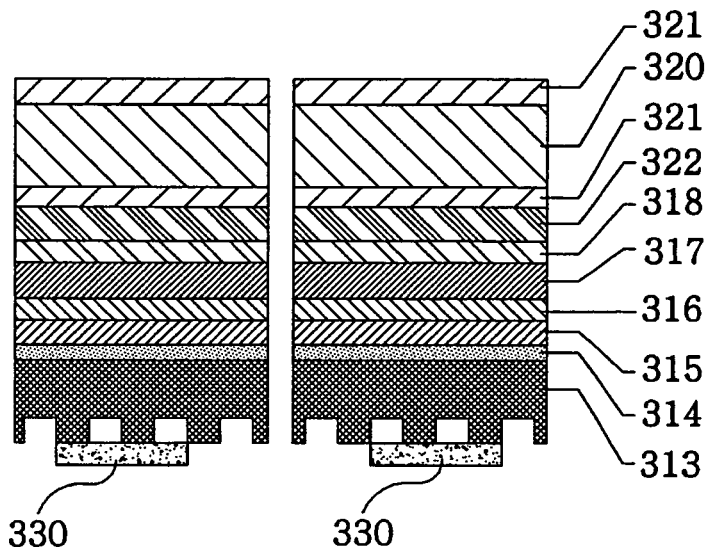

Successively, the N-GaN layer 313 corresponding to each LED is formed thereunder with an N-ohmic contact material 330 (FIG. 7c). Preferably, the N-ohmic contact material 330 formed underneath the N-GaN layer 313 is formed in the shape of a '+' for dispersion of the current. The N-ohmic contact material 330 formed underneath the N-GaN layer 313 may be an N-electrode. Lastly, the structure is separated into individual devices via the scribing and breaking processes (FIGS. 7c and 7d).

Consequently, the method for manufacturing light emitting diodes according to the present invention can enhance the light extraction efficiency of the device, in which patterns are embedded on a top surface of a substrate, a light emitting structure is formed on the pattern-embedded substrate, and patterns are embedded on a surface of the light emitting structure generated by separating the substrate from the light emitting structure.

Figure 8:
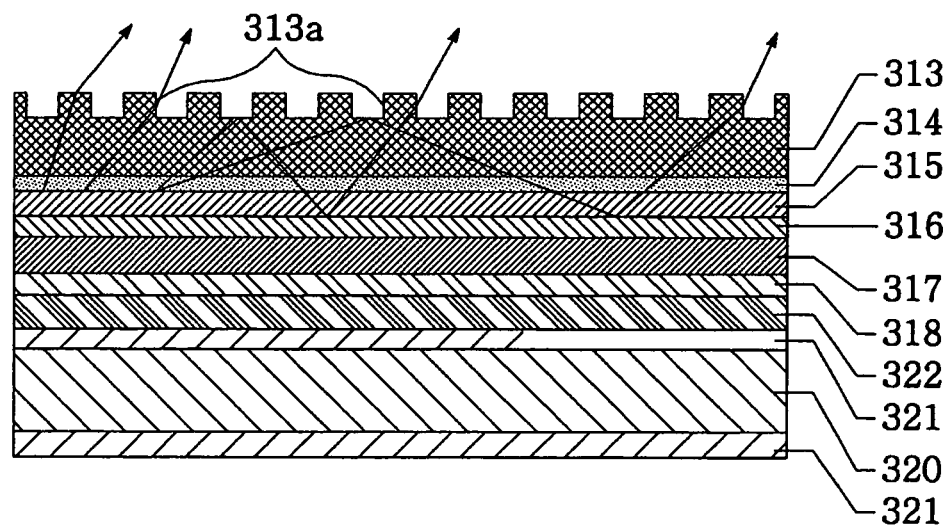
FIG. 8 is a conceptual diagram illustrating a light output of an LED patterned according to the present invention.

FIG. 8 is a conceptual diagram illustrating a light output of an LED patterned according to the present invention, where, if the manufacturing processes of the LEDs as described above are performed, patterns 313a are embedded on a light output surface of the LED, and the patterns generate depressions and protrusions on the light output surface to prevent light emitted from an active layer of the LED from being totally reflected from the light output surface.

In other words, the depressions and protrusions of the light output surface avoid the light emitted from the device from being totally reflected, such that an amount of light discharged outside of the device is made to increase but to decrease the light restrained inside the device, thereby enhancing the light extraction efficiency of the device.

Figure 9:
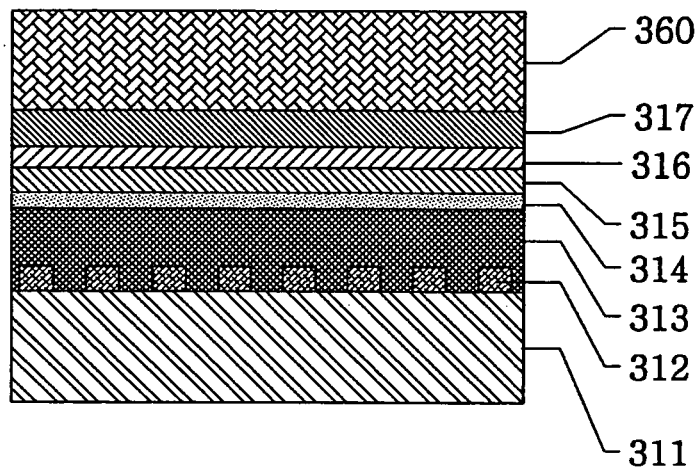
FIG. 9 is a cross-sectional view illustrating a method for manufacturing an LED according to another embodiment of the present invention.

FIG. 9 is a cross-sectional view illustrating a method for manufacturing an LED according to another embodiment of the present invention, wherein a conductive holder instead of the support thus described is formed on a top surface of a first electrode.

In wit, the method for manufacturing the LEDs according to another embodiment of the present invention comprises: forming patterns on a top surface of a substrate; forming on a top surface of the pattern-formed substrate a first layer having a first polarity, an active layer, a second layer having an opposite polarity from that of the first layer, and a first electrode; forming a conductive holder on a top surface of the first electrode; performing a lift-off process in which the patterned substrate is separated from the first layer to form patterns corresponding to those formed on the top surface of the substrate on the first layer; and forming a second electrode on the pattern-impressed first layer.

Therefore, in the present embodiment, following the process of FIG. 4a, the P-ohmic contact material 316 and the reflection metal 317 are formed in sequence on the top surface of the P-GaN layer 315, and the conductive holder 360 is formed on the top surface of the reflection metal 317 and then the substrate is removed.

The conductive holder 360 serves to hold the light emitting structure so that the structure can be lifted and moved in the course of manufacturing the LEDs. At this time, formation of the reflection metal 317 is optional process. The conductive holder 360 may be deposited by way of MOCVD method, but it is desirable to deposit the conductive holder 360 by the electro-plating method for simplicity purpose.

In other words, the conductive holder 360 may be formed by one or more of an electro-plating method, an electroless-plating method, a CVD (Chemical Vapor Deposition) method and a sputtering method.

There is no limit for thickness of the conductive holder 360 but preferably, it is in the range of 10~400 μm. There is no particular restriction for material of the conductive holder 360, but a material having an excellent heat and electricity conductivity and having a thermal expansion coefficient similar to that of an epitaxial layer may be selected. Preferably, the material contains at least one or more of a group of Cu, W, Au, Ni, Mo, Pt, Pd, Co, Ag, Al and Ti.

Figure 10A:
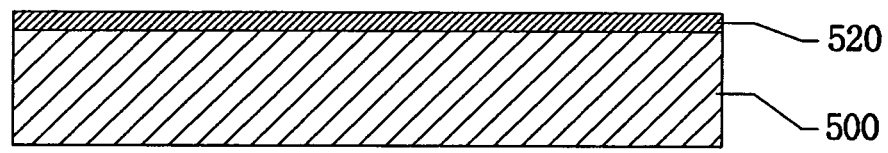
FIGS. 10a to 10d are schematic cross-sectional views illustrating a method of a nano-sized pattern being formed on a top surface of a substrate according to the present invention.
Figure 10B:
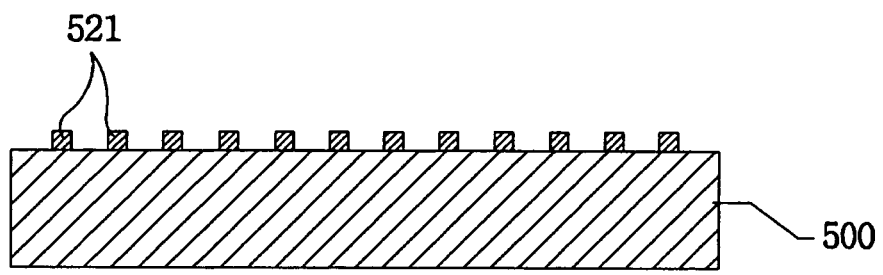
Figure 10C:
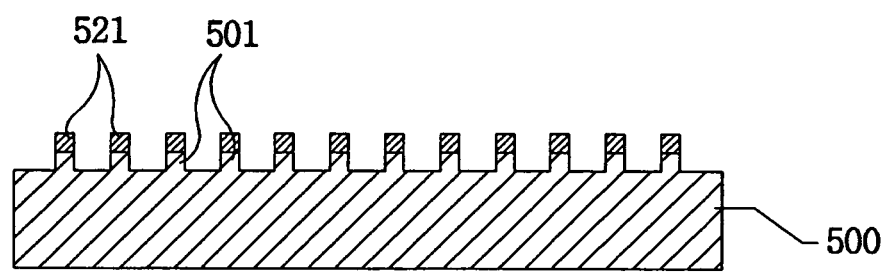
Figure 10D:
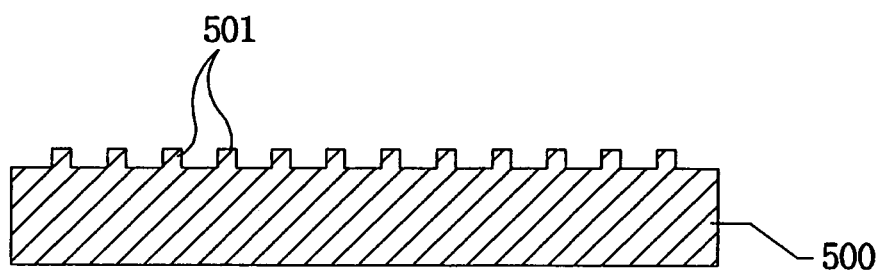

Now, referring to FIGS. 10a to 10d, a metal thin film layer 520 is formed on a top surface of a substrate 500 (FIG. 10a). The metal thin film layer 520 is heat-treated to allow forming a plurality of discrete nano agglomerations 521 (FIG. 10b). Successively, the top surface of the substrate 500 is selectively etched using the nano agglomerations 521 as mask (FIG. 10c). Lastly, the agglomerations 521 are removed to allow forming a plurality of discrete nano rods 501 on the top surface of the substrate 500 (FIG. 10d). As a result, a pattern comprising the nano rods can be formed on the top of the substrate 500 if the processes of FIGS. 10a to 10d are performed. Preferably, height of each rod is in the range of 10~1000 nm, and width thereof is 2~5000 nm.

As apparent from the foregoing, there is an advantage in the method for manufacturing the LEDs thus described in that the light extraction efficiency of the device can be enhanced by forming patterns on a top surface of a substrate, a light emitting structure is formed on the top surface of the substrate patterns corresponding to those formed on the top surface of the substrate, the substrate is removed from the light emitting structure, and pattern impressions are formed on the surface of the light emitting structure.

There is another advantage in that the manufacturing cost can be reduced because a patterned substrate is separated by lift-off process for reuse.

Although the invention is described herein with reference to the preferred embodiments, one skilled in the art will readily appreciate that various modifications and variations may be made without departing from the spirit and scope of the present invention. Such modifications and variations are considered to be within the purview and scope of the appended claims and their equivalents.

What is claimed is:

1. A method for manufacturing light emitting diodes comprising:
    forming a semiconductor structure on a substrate, the semiconductor structure comprising a first layer having a first polarity, an active layer, and a second layer having an opposite polarity to that of the first layer, wherein a surface of the substrate has patterns, the surface contacts the semiconductor structure;
    forming a first electrode on the semiconductor structure, the first electrode comprising a contact of the second polarity to the second layer;
    forming a UBM (Under Bump Metallization) layer on the first electrode, the UBM layer having at least two metal layers, wherein the UBM layer comprises a laminated structure of Ti/Pt/Au, Ti/Au or Pt/Au;
    bonding a support on the UMB layer using a bonding material such that the bonding material forms a bonding layer between the UBM layer and the support;
    performing a lift-off process such that the substrate is separated from the first layer; and
    forming a second electrode on the first layer,
    wherein the UBM layer is located between the first electrode and the bonding layer, and wherein the first electrode is located between the semiconductor structure and the UBM layer,
    wherein while forming the semiconductor structure on the substrate, patterns are formed on a surface of the first layer along patterns which are a part of the substrate and comprised of the same material as the substrate, and
    wherein the second electrode contacts the patterns on the surface of the first layer and an air gap is disposed between the second electrode and the patterns on the surface of the first layer.

2. The method as defined in claim 1, wherein the support comprises:
    a conductive substrate; and
    an ohmic contact located on at least one surface of the conductive substrate.

3. The method as defined in claim 1, further comprising forming a reflection layer between the first electrode and the UBM layer.

4. The method as defined in claim 3, wherein the reflection layer comprises at least one or a combination of Ag, Al, Pt, Au, Ni, Ti, and a transmissive conductive oxide layer.

5. A method for manufacturing light emitting diodes comprising:
    forming a metal film layer on a sapphire substrate;
    heat-treating the metal film layer to form a plurality of nano agglomerations;
    etching the sapphire substrate using the nano agglomerations as a mask to form a plurality of nano rods which are a part of the sapphire substrate and comprised of the same material as the sapphire substrate;
    removing the nano agglomerations;
    forming a semiconductor structure on a surface of the sapphire substrate where the nano rods are formed, the semiconductor structure comprising a first layer having a first polarity, an active layer, and a second layer having an opposite polarity to that of the first layer;
    forming a first electrode on the semiconductor structure;
    forming a conductive holder on the first electrode;
    performing a lift-off process such that the sapphire substrate is separated from the first layer, to form on the first layer patterns corresponding to the nano rods formed on the sapphire substrate; and
    forming a second electrode on the first layer,
    wherein while forming the semiconductor structure on the surface of the sapphire substrate, patterns are formed on a surface of the first layer along with the plurality of nano rods of the sapphire substrate,
    wherein the patterns form a light extraction structure,
    wherein the second electrode contacts the light extraction structure and an air gap is disposed between the second electrode and the light extraction structure.

6. The method as defined in claim 5, further comprising forming a reflection layer between the first electrode and the conductive holder.

7. The method as defined in claim 5, wherein the first layer is an n-GaN layer, and the second layer is a p-GaN layer.

8. The method as defined in claim 1, wherein the substrate comprises any one of a sapphire substrate, a silicon substrate, a zinc oxide substrate and a nitride semiconductor substrate.

9. The method as defined in claim 2, wherein the conductive substrate comprises one or more of Si, AlN, SiC, GaAs, Cu, W, and Mo.

10. The method as defined in claim 5, wherein the conductive holder is formed by any one or more methods of electroplating, electroless plating, a CVD and sputtering.

11. The method as defined in claim 5, wherein a thickness of the conductive holder is in the range of 10~400 μm.

12. The method as defined in claim 5, wherein the material of the conductive holder comprises at least one or more of Cu, W, Au, Ni, Mo, Pt, Pd, Co, Ag, Al and Ti.

13. A method for manufacturing light emitting diodes comprising:
    forming a semiconductor structure on a substrate, the semiconductor structure comprising an n-GaN layer, an active layer, and a p-GaN layer, wherein a surface of the substrate has patterns, the surface contacts the semiconductor structure;
    forming a first electrode on the semiconductor structure, the first electrode comprising a p-contact to the p-GaN layer;
    forming a reflection layer on the first electrode;

forming a UBM (Under Bump Metallization) layer on the reflective layer, the UBM layer having at least two metal layers, wherein the UBM layer comprises at least one of Ti or Pt;

bonding a sub-mount substrate on the UBM layer using a bonding material such that the bonding material forms a bonding layer between the UBM layer and the support;

performing a lift-off process such that the substrate is separated from the N-GaN layer; and forming a second electrode on the n-GaN layer, wherein the UBM layer is located between the reflection layer and the bonding layer, and wherein the reflection layer is located between the semiconductor structure and the UBM layer, wherein while forming the semiconductor structure on the substrate, patterns are formed on a surface of the n-GaN layer along with patterns which are a part of the substrate and comprised of the same materials as the substrate, and wherein the second electrode contact the patterns on the surface of the n-GaN layer and an air gap is disposed between the second electrode and the patterns on the surface of the n-GaN layer.

14. The method as defined in claim 13, wherein the reflection layer comprises one or a combination of Ag, Al, Pt, Au, Ni, Ti, and a transmissive conductive oxide.

15. The method as defined in claim 1, wherein the substrate comprises a template substrate laminated with any one of GaN, InGaN, AlGaN and AlInGaN on any one of a sapphire substrate, a silicon substrate and a zinc oxide substrate, or a dielectric layer on any one of GaN, InGaN, AlGaN and AlInGaN on any one of a sapphire substrate, a silicon substrate and a zinc oxide substrate.

16. The method as defined in claim 1, wherein the first layer is an n-GaN layer, and the second layer is a p-GaN layer.

17. The method as defined in claim 1, wherein the UBM layer contacts the bonding layer.

18. The method as defined in claim 3, wherein the UBM layer contacts the reflection layer.

19. The method as defined in claim 5, wherein the light extraction structure is configured to enhance the light extraction effifiency of the diode.

20. The method as defined in claim 5, wherein the nano agglomerations have a discrete distribution.

21. The method as defined in claim 13, wherein the UBM layer contacts the bonding layer.

22. The method as defined in claim 13, wherein the UBM layer contacts the reflection layer.

23. The method as defined in claim 1, wherein the contact of the second polarity comprises an ohmic contact to the second layer.

24. The method as defined in claim 13, wherein the p-contact comprises a p-ohmic contact to the p-GaN layer.

25. The method as defined in claim 1, wherein the UBM layer further comprises at least one of Ni and Au.

26. The method as defined in claim 1, wherein the bonding layer is configured to enhance adhesion between the UBM layer and the sub-mount.

27. The method as defined in claim 1, wherein the bonding layer comprises solder.

28. The method as defined in claim 13, wherein the UBM layer further comprises at least one of Ni and Au.

29. The method as defined in claim 13, wherein the bonding layer is configured to enhance adhesion between the UBM layer and the sub-mount.

30. The method as defined in claim 13, wherein the bonding layer comprises solder.

* * * * *

UNITED STATES PATENT AND TRADEMARK OFFICE
CERTIFICATE OF CORRECTION

PATENT NO. : 8,709,835 B2  Page 1 of 1
APPLICATION NO. : 11/450343
DATED : April 29, 2014
INVENTOR(S) : See Jong Leem et al.

It is certified that error appears in the above-identified patent and that said Letters Patent is hereby corrected as shown below:

On the title page, item (73) Assignee should read: LG Electronics Inc., Seoul (KR)
LG Innotek Co., Ltd., Seoul (KR)

Signed and Sealed this
Ninth Day of December, 2014

Michelle K. Lee
*Deputy Director of the United States Patent and Trademark Office*